(12) United States Patent
Lu et al.

(10) Patent No.: US 8,368,099 B2
(45) Date of Patent: Feb. 5, 2013

(54) LIGHT EMITTING DEVICE AND FABRICATING METHOD THEREOF

(75) Inventors: Chien-Chun Lu, Danshuei Township, Taipei County (TW); Chia-Tai Kuo, Taipei (TW); Chen-Peng Hsu, Kaohsiung (TW); Hung-Lieh Hu, Hsinchu (TW); Chien-Jen Sun, Jhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 348 days.

(21) Appl. No.: 12/182,218

(22) Filed: Jul. 30, 2008

(65) Prior Publication Data

US 2009/0115313 A1     May 7, 2009

(30) Foreign Application Priority Data

Nov. 7, 2007   (TW) ............................... 96142117 A

(51) Int. Cl.
    *H01L 33/00*    (2010.01)
(52) U.S. Cl. ............. 257/98; 257/99; 257/100; 257/80; 257/79; 313/498; 313/501; 313/512; 362/555
(58) Field of Classification Search .......... 313/483–512; 257/98, 99, 100, 80, 79; 362/235, 227, 231, 362/293, 545, 555, 800
See application file for complete search history.

(56) References Cited

U.S. PATENT DOCUMENTS

| | | | |
|---|---|---|---|
| 5,959,316 A | 9/1999 | Lowery | |
| 6,274,924 B1 | 8/2001 | Carey et al. | |
| 6,468,821 B2 * | 10/2002 | Maeda et al. | 438/29 |
| 6,531,328 B1 | 3/2003 | Chen | |
| 6,642,652 B2 | 11/2003 | Collins, III et al. | |
| 6,650,044 B1 | 11/2003 | Lowery | |
| 6,696,704 B1 * | 2/2004 | Maeda et al. | 257/98 |
| 6,707,069 B2 | 3/2004 | Song et al. | |
| 6,806,583 B2 | 10/2004 | Koay et al. | |
| 7,049,159 B2 | 5/2006 | Lowery | |
| 7,129,638 B2 | 10/2006 | Ng et al. | |
| 7,282,853 B2 * | 10/2007 | Yano et al. | 313/498 |
| 2002/0011601 A1 * | 1/2002 | Furukawa et al. | 257/98 |

(Continued)

FOREIGN PATENT DOCUMENTS

| | | |
|---|---|---|
| JP | 2004179644 A | 6/2004 |
| TW | I248220 | 1/2006 |

(Continued)

*Primary Examiner* — Nimeshkumar Patel
*Assistant Examiner* — Thomas A Hollweg
(74) *Attorney, Agent, or Firm* — Rabin & Berdo, P.C.

(57) ABSTRACT

A light emitting device and a fabricating method thereof are described. The light emitting device includes a substrate, a light emitting chip, a tubular structure, and a fluorescent conversion layer. The tubular structure is formed on a surface of the substrate. The light emitting chip is disposed on the surface of the substrate and is surrounded by the tubular structure. The fluorescent conversion layer is disposed in the tubular structure and covers the light emitting chip. A ratio of a maximal vertical thickness and a maximal horizontal thickness of the fluorescent conversion layer at the light emitting chip is between 0.1 and 10. A distance for the light ray to pass through the fluorescent conversion layer is controlled by using the tubular structure, so as to solve a problem of the conventional art that fluorescent powder coating package technique results in non-uniform color temperature of the emitted light.

13 Claims, 15 Drawing Sheets

U.S. PATENT DOCUMENTS

| | | | |
|---|---|---|---|
| 2002/0028527 A1* | 3/2002 | Maeda et al. | 438/29 |
| 2002/0187571 A1 | 12/2002 | Collins et al. | |
| 2006/0000347 A1 | 1/2006 | Preece | |
| 2006/0003477 A1 | 1/2006 | Braune et al. | |
| 2006/0006405 A1 | 1/2006 | Mazzochette | |
| 2006/0108594 A1 | 5/2006 | Iwasaki et al. | |
| 2007/0096131 A1 | 5/2007 | Chandra | |
| 2008/0023711 A1* | 1/2008 | Tarsa et al. | 257/98 |

FOREIGN PATENT DOCUMENTS

| | | |
|---|---|---|
| WO | WO-2004/040661 A2 | 5/2004 |

* cited by examiner

| The ratio of a maximal vertical thickness L1 and a maximal horizontal thickness L2 in light emitting chip | Color temperature of prior art | Color temperature of the present invention |
|---|---|---|
| 0.1 | 1000-2000K | <1000K |
| 1.5 | | <300k |
| 1.8 | | 221k |
| 4 | | <300k |
| 10 | | <1000K |

Fig.7

LIGHT EMITTING DEVICE AND FABRICATING METHOD THEREOF

CROSS-REFERENCE TO RELATED APPLICATIONS

This non-provisional application claims priority under 35 U.S.C. §119(a) on Patent Application No(s). 096142117 filed in Taiwan, R.O.C. on Nov. 7, 2007 the entire contents of which are hereby incorporated by reference.

BACKGROUND OF THE INVENTION

1. Field of Invention

The present invention relates to a light emitting device and a fabricating method thereof. More particularly, the present invention relates to a light emitting device using a circularly disposed tubular structure to solve a problem of non-uniform color temperature of emitted light, and a fabricating method thereof.

2. Related Art

White light spectrum is a successive spectrum, and the white light viewable by human eye is formed by mixing lights with at least two or more colors (wavelengths), for example, the white light can be formed by mixing three primary colors (red light+green light+blue light), or can be formed by mixing complementary colors, such as (blue light+yellow light) or (cyan light+red light). According to the principle of forming the white light, recently, the white light emitting diodes (LEDs) can be approximately classified into two types. The first type is a white LED of three primary color type, which is composed of three semiconductor chips respectively emitting red light, green light, and blue light, and is also referred to as a multi-chip white LED or a triple wavelength white LED. The other type is a white LED of complementary color type, in which a single LED chip emitting a light ray with a single color is used, and fluorescent powder capable of being excited by the color light ray to emit a light ray with a color complementary to that of the color light ray, so it is also referred to as a single-chip white LED. However, when using the multi-chip white LED, the difference of the semiconductor materials results in the difficulty on the design of drive circuit.

Referring to FIG. 1, a schematic view of a conventional single-chip white LED is shown. In the single-chip white LED, fluorescent powder and gel are formulated according to a specific ratio to form a fluorescent conversion layer 10, and the fluorescent conversion layer 10 directly surrounds an LED chip 13 and fills up a cup 14. Therefore, when the LED chip 13 emits light, generated light rays pass through the fluorescent conversion layer 10, and blue light rays emitted by the LED chip 13 and yellow light rays excited from the fluorescent conversion layer 10 by the blue light rays are mixed to obtain the white light. For the light rays emitted in different angles from the LED 13, the paths to the fluorescent conversion layer 10 vary, and the distances for the light rays to pass through the fluorescent conversion layer 10 are different. The light ray 111 with a larger incident angle passes through the fluorescent conversion layer 10 and is redirected by the reflective wall 15. The path distance of passing through the fluorescent conversion layer 10 is longer; therefore, the energy is mostly converted to the yellow light excited from the fluorescent conversion layer 10 and forms the white light similar to the yellow light on the periphery of the cup 14. Accordingly, the single-chip white LED shows an annular yellow light region on the periphery of the emitted white light, that is, halo phenomenon. The light ray 112 with a smaller incident angle emits upwardly without being redirected, so that the path of passing through the fluorescent conversion layer 10 is shorter, and the energy is mostly at the blue light emitted by the LED chip 13. Consequently, when the single-chip white LED is measured, it is found that color temperatures are different at different positions, and the difference of the color temperatures can be up to 700 K at most, thus resulting in a problem of non-uniform color temperature of the emitted light ray.

Referring to FIG. 2, a schematic view of a conventional multi-chip white LED is shown. In the multi-chip white LED, fluorescent powder and gel are formulated according to a specific ratio to form a fluorescent conversion layer 20, and the fluorescent conversion layer 20 directly surrounds LED chips 18a, 18b, and 18c, and fills up a cup 19. In addition to the halo phenomenon mentioned in the single-chip white LED, the phenomenon of non-uniform color temperature is obvious to be detected by viewing from the top of the cup 19, since mostly the light emitted from the surface of the chip in the multi-chip white LED passes through the fluorescent conversion layer 20 upwardly, whereas the light rays emitted by two chips pass through the fluorescent conversion layer 20 in-between chips at the same time, so that the color temperature of the light emitted between the chips is lower than that of the light emitted from the surface of chip.

Theoretically, same color temperature could be achieved by having the emitting blue light pass through the equal distance of the fluorescent material. Accordingly, solutions as to forming the uniform thickness of fluorescent material are fervently discussed and proposed. In the U.S. Pat. No. 5,959,316, entitled "Multiple en-capsulation of phosphor-LED devices", a transparent hemispherical spacer of resin is formed and fixed first for fluorescent material to flow to conform to shape. The layer of fluorescent material is claimed to be uniform thickness, however, arrangement as mentioned will make the manufacturing process difficult to implement. In the U.S. Pat. No. 7,129,638, entitled "Light emitting devices with a phosphor coating having evenly dispersed phosphor particles and constant thickness", a fixed fluorescence conversion layer is formed by uniformly subsiding the fluorescent powder with gel on the LED chip before the gel is cured. The material selection and complex manufacturing process will limit the application. In the U.S. Pat. No. 6,650,044, entitled "Stenciling phosphor layers on light emitting diodes", the problem of unequal color temperature is effectively resolved by disposing the phosphor layer of uniform thickness around the chip surface through conformal packaging. Due to the manufacturing process, the eligible method of packaging will be limited to flip chip, waiving the use of wire bond, so that the breaking of wire bond could be saved. In the Japan patent 2004-179644 "PHOSPHOR LAMINATION AND LIGHT SOURCE USING THE SAME", the problem of unequal color temperature is also effectively resolved by adhering the fluorescence conversion layer with uniform thickness to the chip surface through screen printing. This conformal packaging again suits merely to the flip chip owing to the manufacturing process. In the patent US2006/0003477 (W02004040661) entitled "METHOD FOR PRODUCING A LIGHT SOURCE PROVIDED WITH ELECTROLUMINESCENT DIODES AND COMPRISING A LUMINESCENCE CONVERSION ELEMENT", the desired effect of same color temperature, though possible, is achieved painstakingly by controlling the machines and manufacturing process precisely. Furthermore, the manufacturing process has to be executed directly on the LED chip.

SUMMARY OF THE INVENTION

Therefore, in order to solve the problem of non-uniform color temperature of the light rays emitted by the white LED, the present invention provides a light emitting device and a fabricating method thereof, that is a light emitting device with a circularly disposed tubular structure and a fabricating method thereof.

The light emitting device of the present invention includes a substrate, at least one tubular structure, at least one light emitting chip, and at least one fluorescent conversion layer. The substrate has a surface. The at least one tubular structure is formed on the surface, two ends of the tubular structure respectively have an opening, and the tubular structure is disposed on the surface by one end. The at least one light emitting chip has a plurality of exit surfaces, and the light emitting chip is disposed on the surface and is surrounded by the tubular structure. The at least one fluorescent conversion layer is disposed in the tubular structure and surrounds the light emitting chip, and a ratio of a maximal vertical thickness and a maximal horizontal thickness of the fluorescent conversion layer at the light emitting chip is between 0.1 and 10. A material of the tubular structure is provided for light rays emitted by the light emitting chip and light rays excited from the fluorescent conversion layer to pass through.

The fabricating method of the light emitting device of the present invention includes disposing at least one light emitting chip on a surface of a substrate, forming at least one tubular structure on the surface of the substrate and encircling the light emitting chip, and disposing a fluorescent conversion layer in the tubular structure and surrounding the light emitting chip.

In the present invention, the tubular structure is used to control the distribution scope of the fluorescent conversion layer and a distance for the light ray emitted from the light emitting chip to pass through the fluorescent conversion layer. The material of the tubular structure is provided for the light rays emitted by the light emitting chip and the light rays excited from the fluorescent conversion layer to pass through, so under the situation of not considering the reflection, the path distance of the light ray emitted by the light emitting chip passing through the fluorescent conversion layer is controlled, so as to solve the problem of the conventional art that fluorescent powder coating package technique results in non-uniform color temperature of the emitted light.

BRIEF DESCRIPTION OF THE DRAWINGS

The present invention will become more fully understood from the detailed description given herein below for illustration only, and thus are not limitative of the present invention, and wherein:

FIG. 7 is a color temperature table of the emitting element surface when the ratio of a maximal vertical thickness L1 and a maximal horizontal thickness L2 is controlled;

DETAILED DESCRIPTION OF THE INVENTION

Figure 1:
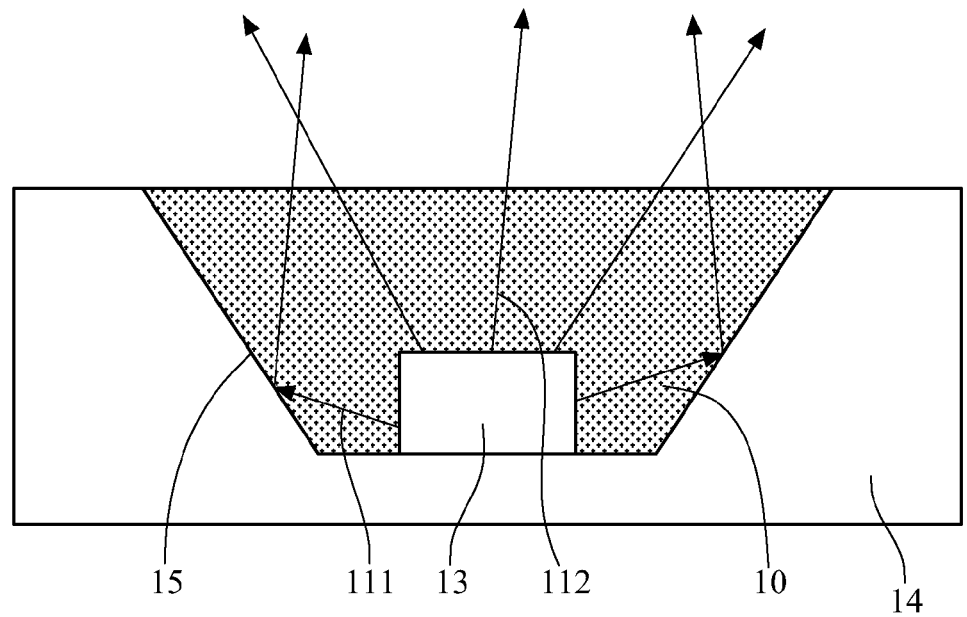
FIG. 1 is a schematic view of a conventional single-chip white LED.
Figure 2:
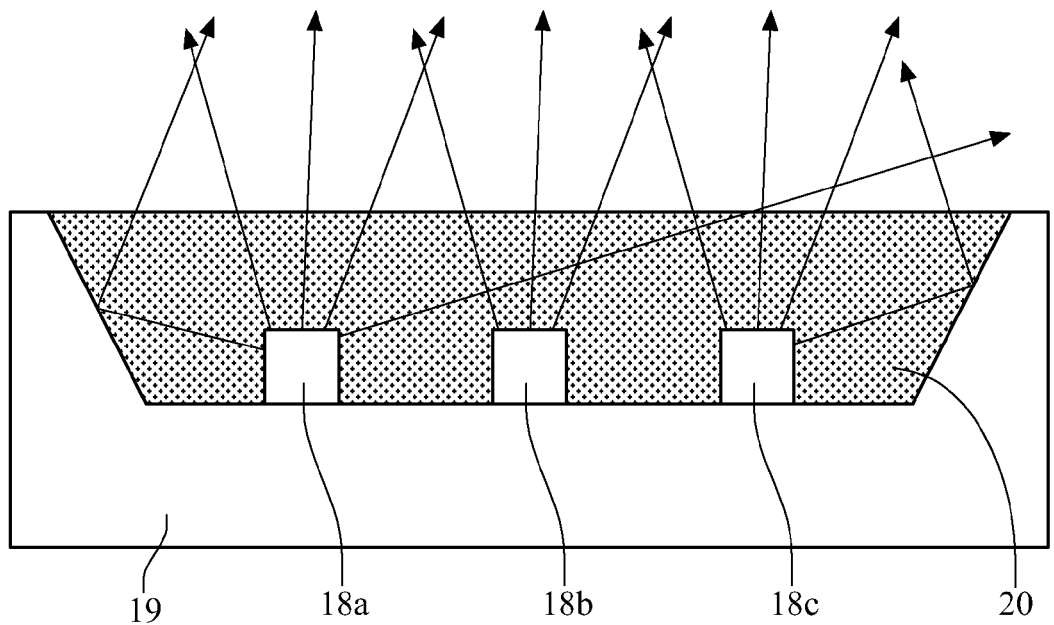
FIG. 2 is a schematic view of a conventional multi-chip white LED.
Figure 3:
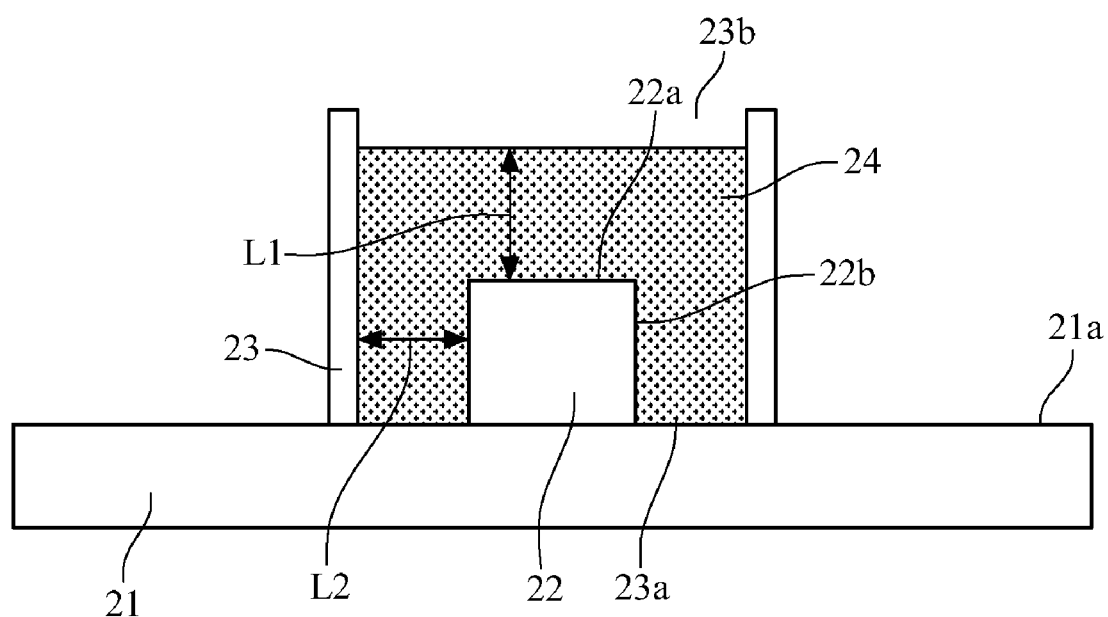
FIG. 3 is a schematic view of an axial section of a first embodiment of the present invention.

Referring to FIG. 3, a schematic view of an axial section of a first embodiment of the present invention is shown. A light emitting device 100 includes a substrate 21, a light emitting chip 22, a tubular structure 23, and a fluorescent conversion layer 24.

The substrate 21 has a surface 21a. The substrate 21 is made of a heat conductive material, and the material of the substrate 21 can be, but is not limited to, ceramic, metal, organic polymer, or silicon.

The light emitting chip 22 is disposed on the surface 21a of the substrate 21. The light emitting chip 22 can be a LED chip, and definitely can be a laser diode (LD) chip. The light emitting chip 22 has a front surface 22a and a side surface 22b.

Figure 4A:
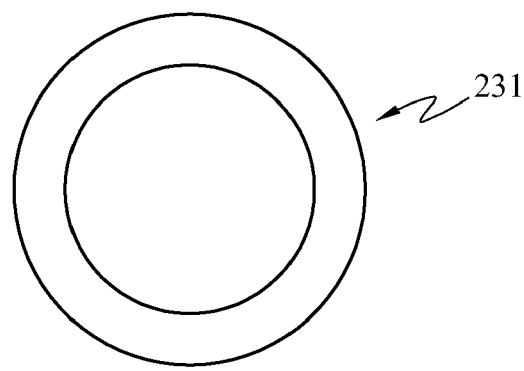
FIG. 4A is a schematic view of a shape of a radial section of the tubular structure according to the first embodiment of the present invention.
Figure 4B:
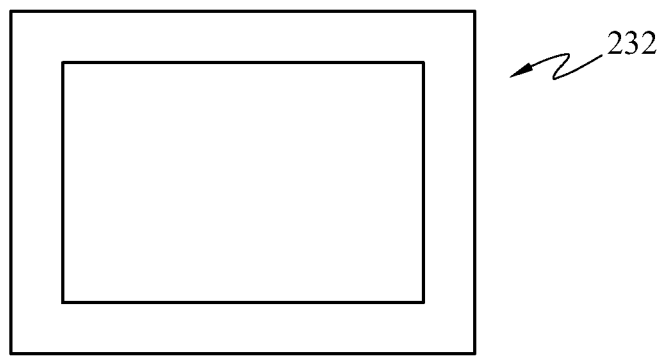
FIG. 4B is another schematic view of a shape of the radial section of the tubular structure according to the first embodiment of the present invention.
Figure 4C:
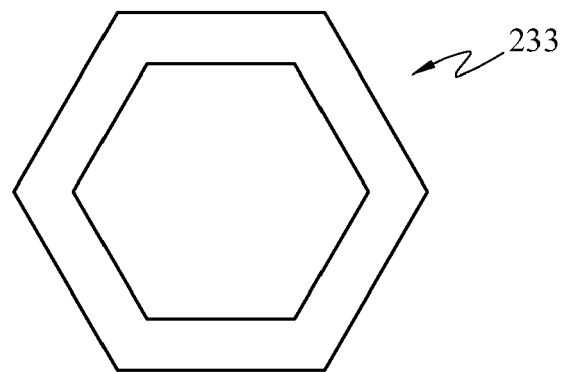
FIG. 4C is still another schematic view of the radial section of the tubular structure according to the first embodiment of the present invention.

The tubular structure 23 is formed on the surface 21a of the substrate 21 and encircles the light emitting chip 22. Two ends of the tubular structure 23 respectively have an opening 23a and 23b. The tubular structure 23 is disposed on the surface 21a by an end that is nearly the opening 23a. A material of the tubular structure 23 is provided for light rays emitted by the light emitting chip 22 and light rays excited from the fluorescent conversion layer 24 to pass through. The material of the tubular structure 23 is silica gel, resin, glass, or a mixture of silica gel and silica. The method of forming the tubular structure 23 can be, but is not limited to, photolithography process, laser writing process, mold pressing, etching, or injection molding. A shape of a radial section of the tubular structure 23 is circle 231, and definitely can be polygonal, such as quadrangle 232 or hexagon 233. Referring to FIG. 4A, a schematic view of a shape of the radial section of the tubular structure according to the first embodiment of the present invention is shown, in which the shape of the radial section of the tubular structure is circle 231. Referring to FIG. 4B, another schematic view of the shape of the radial section of the tubular structure of the present invention is shown, in which the shape of the radial section of the tubular structure is quadrangle 232. Referring to FIG. 4C, still another schematic view of the shape of the radial section of the tubular structure of the present invention is shown, in which the shape of the radial section of the tubular structure is hexagon 233.

Figure 5A:
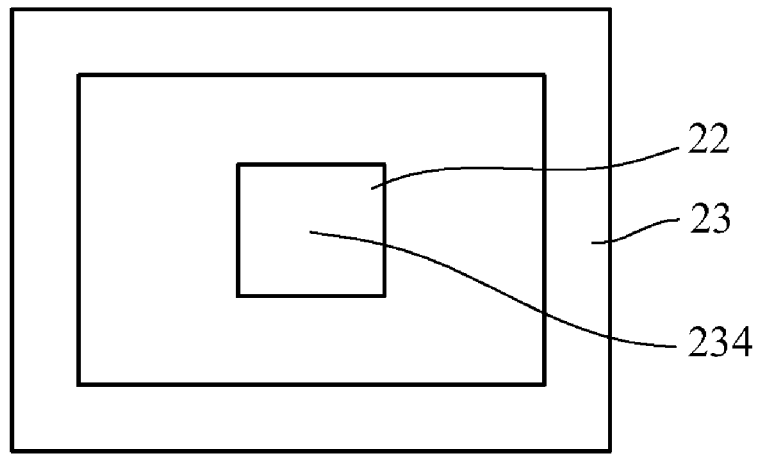
FIG. 5A is a schematic view of a position of the light emitting chip in the tubular structure according to the first embodiment of the present invention.
Figure 5B:
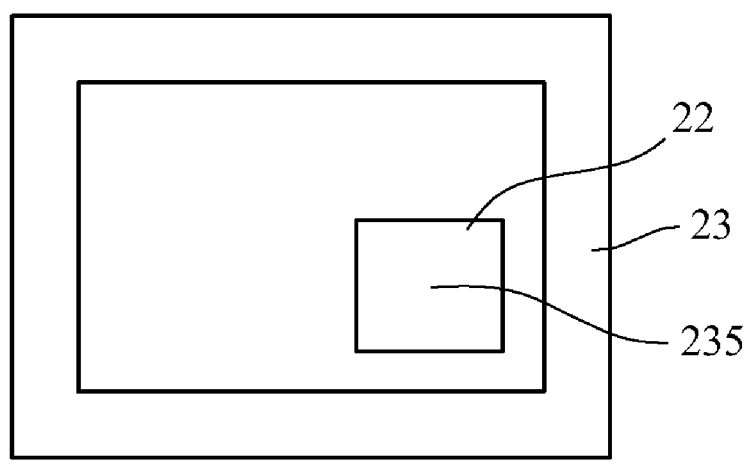
FIG. 5B is a schematic view of a position of the light emitting chip in the tubular structure according to the first embodiment of the present invention.

The position of the light emitting chip 22 in the tubular structure 23 can be on a central axis position 234 of the tubular structure 23, and definitely can be on an off-axis position 235. Referring to FIG. 5A, a schematic view of a position of the light emitting chip in the tubular structure according to the first embodiment of the present invention is shown, in which the position of the light emitting chip 22 in the tubular structure 23 is on the central axis position 234. Referring to FIG. 5B, another schematic view of the light emitting chip in the tubular structure of the present invention is shown, in which the position of the light emitting chip 22 in the tubular structure 23 is on the off-axis position 235.

Figure 6A:
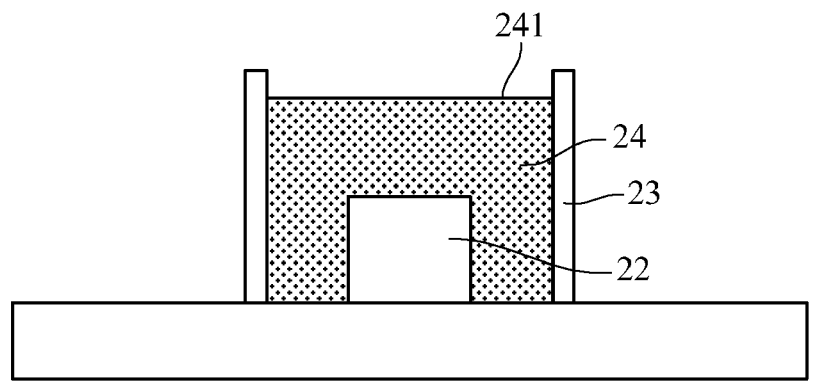
FIG. 6A is a schematic view of a shape of the liquid level of the fluorescent conversion layer according to the first embodiment of the present invention.
Figure 6B:
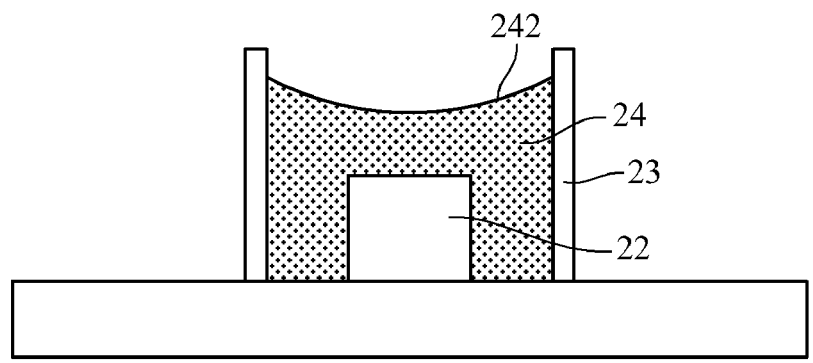
FIG. 6B is another schematic view of a shape of the liquid level of the fluorescent conversion layer according to the first embodiment of the present invention.
Figure 6C:
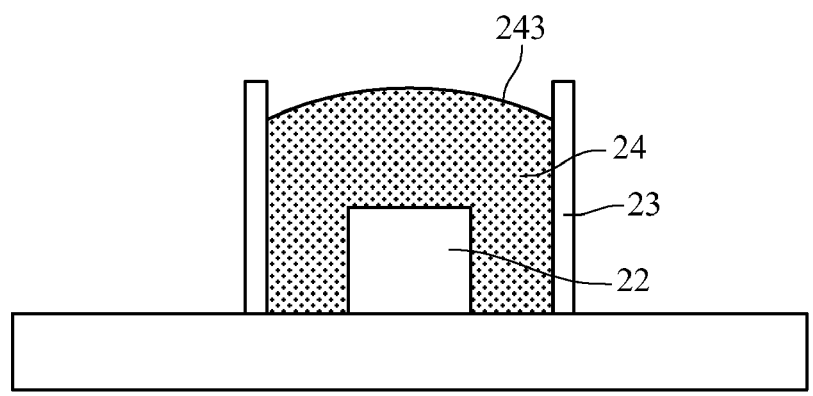
FIG. 6C is still another schematic view of a shape of the liquid level of the fluorescent conversion layer according to the first embodiment of the present invention.

The fluorescent conversion layer 24 is disposed in the tubular structure 23 and surrounds the light emitting chip 22, in which after the fluorescent conversion layer 24 is disposed in the tubular structure 23 and surrounds the light emitting chip 22, the liquid level between the fluorescent conversion layer 24 and the air is a horizontal, and definitely can be a curve. The liquid level between the fluorescent conversion layer 24 and the air is the curved surface, which has a directivity function, i.e., an effect of focusing the light rays emitted by the light emitting chip 22 in the same direction. Referring to FIG. 6A, a schematic view of a shape of the liquid level of the fluorescent conversion layer according to the first embodiment of the present invention is shown, in which the liquid level of the fluorescent conversion layer 24 is a horizontal 241. Referring to FIG. 6B, another schematic view of the shape of the liquid level of the fluorescent conversion layer of the present invention is shown, in which the shape of the liquid shape of the fluorescent conversion layer 24 is a concave 242. Referring to FIG. 6C, still another schematic view of the shape of the liquid level of the fluorescent conversion layer of the present invention is shown, in which the shape of the liquid level of the fluorescent conversion layer 24 is a convex 243.

Figure 6D:
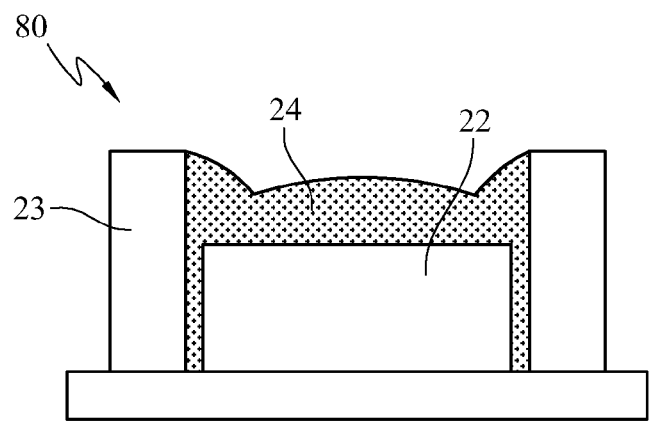
FIG. 6D is a schematic view of light emitting device having a small gel amount.
Figure 6E:
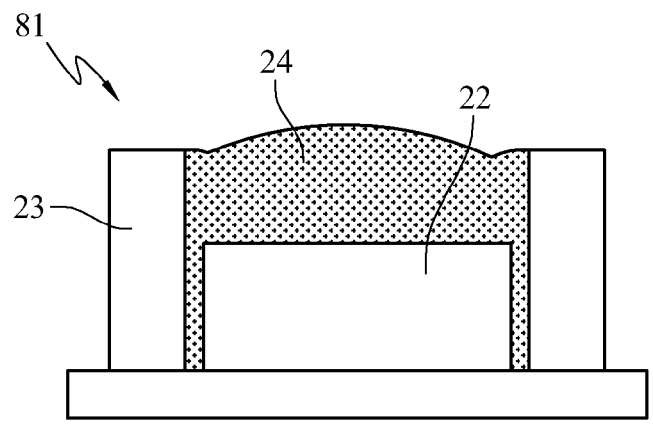
FIG. 6E is a schematic view of light emitting device having a middle gel amount.
Figure 6F:
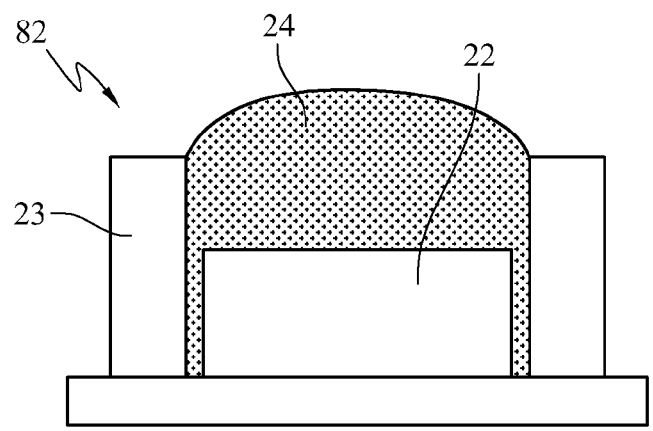
FIG. 6F is a schematic view of light emitting device having a large gel amount.
Figure 6G:
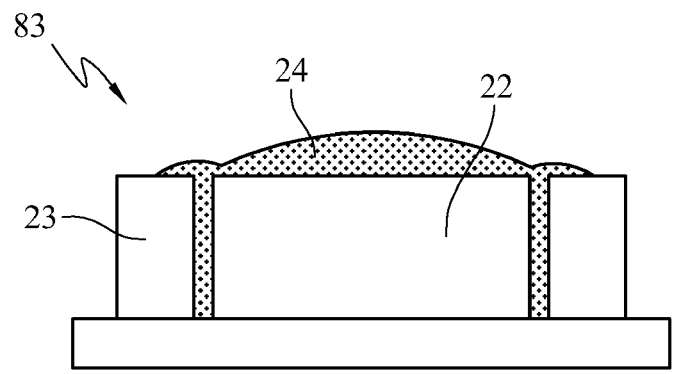
FIG. 6G is a schematic view of light emitting device having a small gel amount.
Figure 6H:
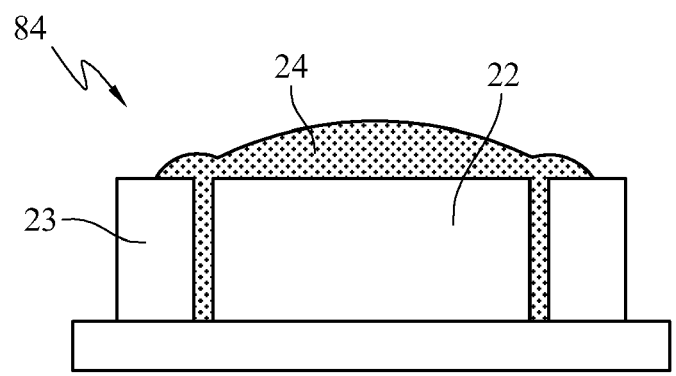
FIG. 6H is a schematic view of light emitting device having a middle gel amount.
Figure 6I:
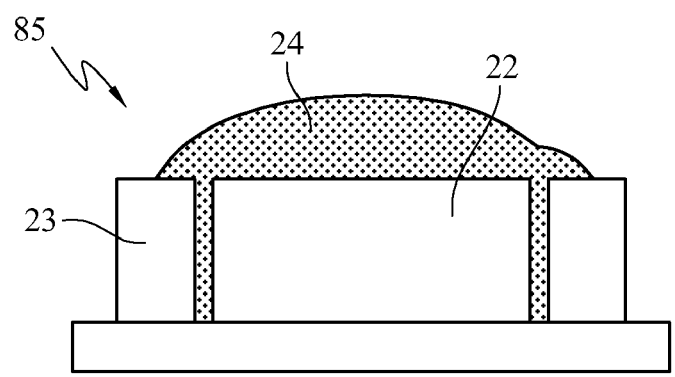
FIG. 6I is a schematic view of light emitting device having a large gel amount.
Figure 6J:
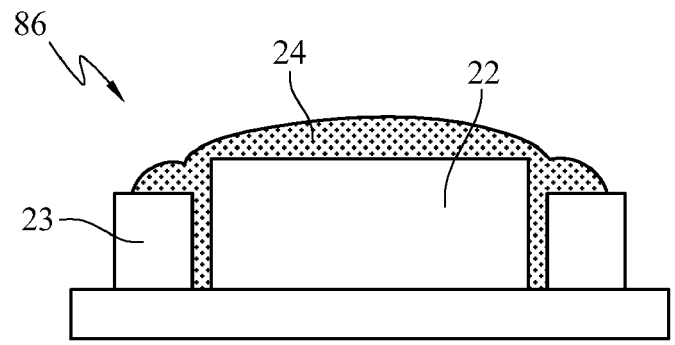
FIG. 6J is a schematic view of light emitting device having a small gel amount.
Figure 6K:
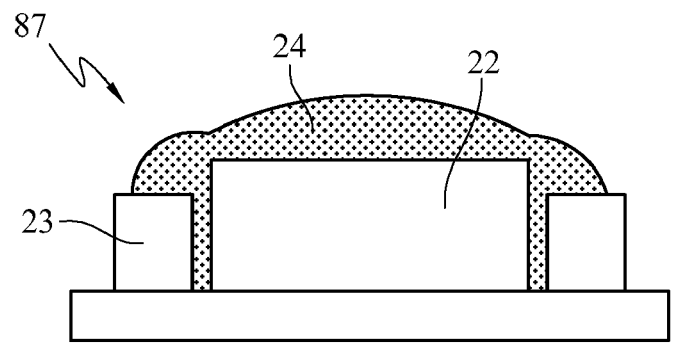
FIG. 6K is a schematic view of light emitting device having a middle gel amount.
Figure 6L:
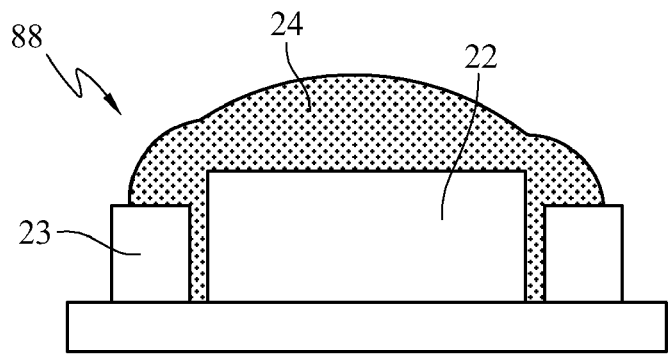
FIG. 6L is a schematic view of light emitting device having a large gel amount.

The tubular structure 23 is formed on the surface 21a of the substrate 21 as the light emitting chip 22, and the tubular structure 23 encircles the light emitting chip 22. The height of the tube walls of the tubular structure 23 can be higher, equal to, or lower than that of the light emitting chip 22. The fluorescent conversion layer 24 fills in the tubular structure 23 and surrounds the light emitting chip 22. The height of the fluorescent conversion layer 24 filling in the tubular structure 23 is determined by gel amount of the filled fluorescent conversion layer 24. Referring to FIG. 6D, FIG. 6E, and FIG. 6F, in which the height of the tube walls of the tubular structure 23 is higher than that of the light emitting chip 22, and according to the gel amount of the fluorescent conversion layer 24 filling in the tubular structure 23, a light emitting device with small gel amount 80, a light emitting device with middle gel amount 81, or a light emitting device with large gel amount 82 can be differentiated. Referring to FIG. 6D, a schematic view of light emitting device having a small gel amount is shown. Referring to FIG. 6E, a schematic view of light emitting device having a middle gel amount is shown. Referring to FIG. 6F, a schematic view of light emitting device having a large gel amount is shown. Referring to FIG. 6G, FIG. 6H, and FIG. 6I, in which the height of the tube walls of the tubular structure 23 is equal to that of the light emitting chip 22, and according to the gel amount of the fluorescent conversion layer 24 filling in the tubular structure 23, a light emitting device with small gel amount 83, a light emitting device with middle gel amount 84, or a light emitting device with large gel amount 85 can be differentiated. Referring to FIG. 6G, a schematic view of light emitting device having a small gel amount is shown. Referring to FIG. 6H, a schematic view of light emitting device having a middle gel amount is shown. Referring to FIG. 6I, a schematic view of light emitting device having a large gel amount is shown. Referring to FIG. 6J, FIG. 6K, and FIG. 6L, in which the height of the tube walls of the tubular structure 23 is lower than that of the light emitting chip 22, and according to the gel amount of the fluorescent conversion layer 24 filling in the tubular structure 23, a small gel amount light emitting device 86, a middle gel amount light emitting device 87, or a large gel amount light emitting device 88 can be differentiated. Referring to FIG. 6J, a schematic view of light emitting device having a small gel amount is shown. Referring to FIG. 6K, a schematic view of light emitting device having a middle gel amount is shown. Referring to FIG. 6L, a schematic view of light emitting device having a large gel amount is shown.

The material of the tubular structure 23 is provided for the light rays emitted by the light emitting chip 22 and the light rays excited from the fluorescent conversion layer 24 to pass through. Accordingly, under a situation of not considering the reflection, the design of the tubular structure 23 and the gel amount of the fluorescent conversion layer 24 injected into the tubular structure 23 can affect distance of the light ray passing through the fluorescent conversion layer 24 after being emitted from the surface of the light emitting chip 22.

If the ratio of a maximal vertical thickness L1 and a maximal horizontal thickness L2 of the fluorescent conversion layer 24 at the light emitting chip 22 is between 0.1 and 10, the path distance of the light emitted from the light emitting chip 22 passing through the fluorescent conversion layer 24 can be controlled to achieve the light of uniform color temperature.

According to the experiment results, a preferred ratio of a maximal vertical thickness L1 and a maximal horizontal thickness L2 of the fluorescent conversion layer 24 at the light emitting chip 22 is within various ranges according to different light emitting chips 22 adopted or various light emitting characteristics. This is because the ratio of the light throughputs of the front surface and the side surface varies owning to different kinds or light emitting characteristics of light emitting chip 22, the required coating thickness ratio of the fluorescent conversion layer 24 is not a fixed value. For example, for the common face-up light emitting chip, the light throughput in vertical direction contributes 60% to 80% of the totality of light emitting amount, whereas the light throughput in horizontal direction contributes 20% to 40% of that the light emitting amount. Being in that case, a ratio of the light throughput of the vertical direction and the horizontal direction is 1.5 to 4, and the optimal ratio of a maximal vertical thickness L1 versus a maximal horizontal thickness L2 is 1.5 to 4 in the common face-up light emitting chip.

Referring to FIG. 7, a color temperature table of the emitting element surface is shown, when the ratio of a maximal vertical thickness L1 and a maximal horizontal thickness L2 is controlled. The light of the thin GaN light emitting chip throughput in vertical direction contributes approximately 97% of the totality of light emitting amount, whereas the light throughput in horizontal direction contributes approximately 3% of that of the light emitting amount. As for the traditional light emitting chip adopted thin GaN as the light emitting element, the margin error of the color temperature of the emitted light is about 1000 to 1500K, but said margin error is controlled within 1000K after the adjustment of the thickness of the fluorescent conversion layer 24, when the ratio of a maximal vertical thickness L1 versus a maximal horizontal thickness L2 of the fluorescent conversion layer 24 at the light emitting chip 22 is between 0.1 and 10; and the margin error of the color temperature of the emitted light could even be controlled within 300K, when the ratio of a maximal vertical thickness L1 versus a maximal horizontal thickness L2 of the fluorescent conversion layer 24 at the light emitting chip 22 is between 1.5 and 4. The adjustment of the vertical thickness L1 of the fluorescent conversion layer 24 versus the horizontal one L2 effectively reduce the phenomenon of the non-uniform color temperature of the emitted light. The light rays emitted from the light emitting chip 22 with larger incident angle directly penetrate the tubular structure 23 owning to the features of material of the tubular structure 23. This resolves the problem existing in the conventional arts that the light rays are reflected by the reflective walls on the two sides, the path distance of passing through the fluorescent conversion layer 24 is longer, the energy is mostly converted into yellow light excited from the fluorescent conversion layer 24, and thus the non-uniform of the color temperature is produced. When the light emitting chip 22 in the light emitting device 100 emits the light rays from different angles, although distances of path passing through the fluorescent conversion layer 24 are different, the tubular structure 23 is used to control the distribution scope of the fluorescent conversion layer 24 so as to adjust the ratio of the maximal vertical thickness L1 versus the maximal horizontal thickness L2. The material of the tubular structure 23 is provided for the light rays emitted by the light emitting chip 22 and the light rays excited from the fluorescent conversion layer 24 to penetrate. Under the situation of not considering the reflection, the path distance of the light ray emitted by the light emitting chip 22 passing through the fluorescent conversion layer 24 is controlled so as to solve the problem of the conventional art of the non-uniform color temperature of the emitted light.

Figure 8:
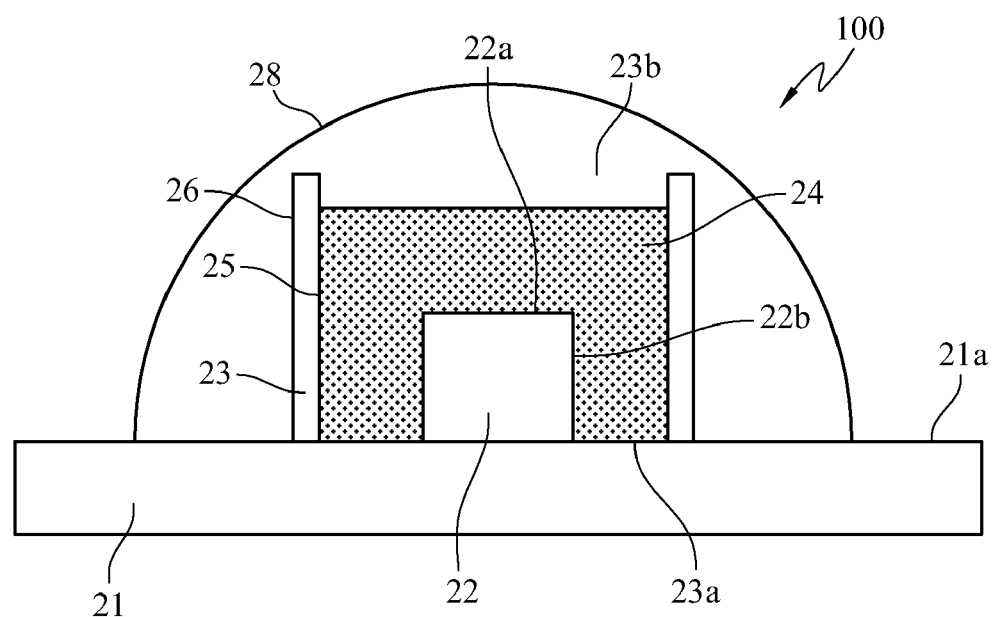
FIG. 8 is a schematic view of an axial section of a second embodiment of the present invention.

Referring to FIG. 8, a schematic view of the axial section according to a second embodiment of the present invention is shown. The second embodiment is the same as the first embodiment except that the light emitting device 100 further includes a microlens 28 disposing on the surface 21a of the substrate 21 and covering the tubular structure 23. The microlens 28 is used to focus the light rays from various directions and angles emitted by the light emitting device 100 as illustrated in the first embodiment.

Figure 9:
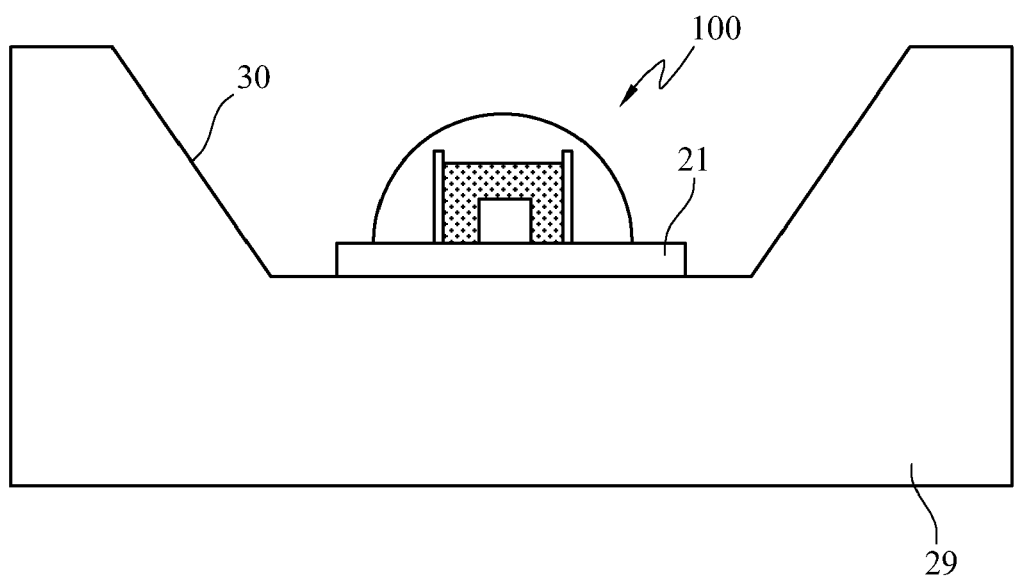
FIG. 9 is a schematic view of an axial section of a third embodiment of the present invention.

Referring to FIG. 9, a schematic view of the axial section according to a third embodiment of the present invention is shown. The third embodiment is the same as the second embodiment except that a package carrier 29 formed with reflective layer 30 is further provided. The package carrier 29 is a cup carrier for carrying the substrate 21, and a reflective layer 30 is formed on an inner surface of the package carrier 29 for reflecting and focusing the light rays emitted by the light emitting device 100 in the same direction. The material of the package carrier 29 can be, but is not limited to, ceramic, metal, plastic, or resin. The material of the reflective layer 30 can be, but is not limited to, metal or semiconductor.

Figure 10:
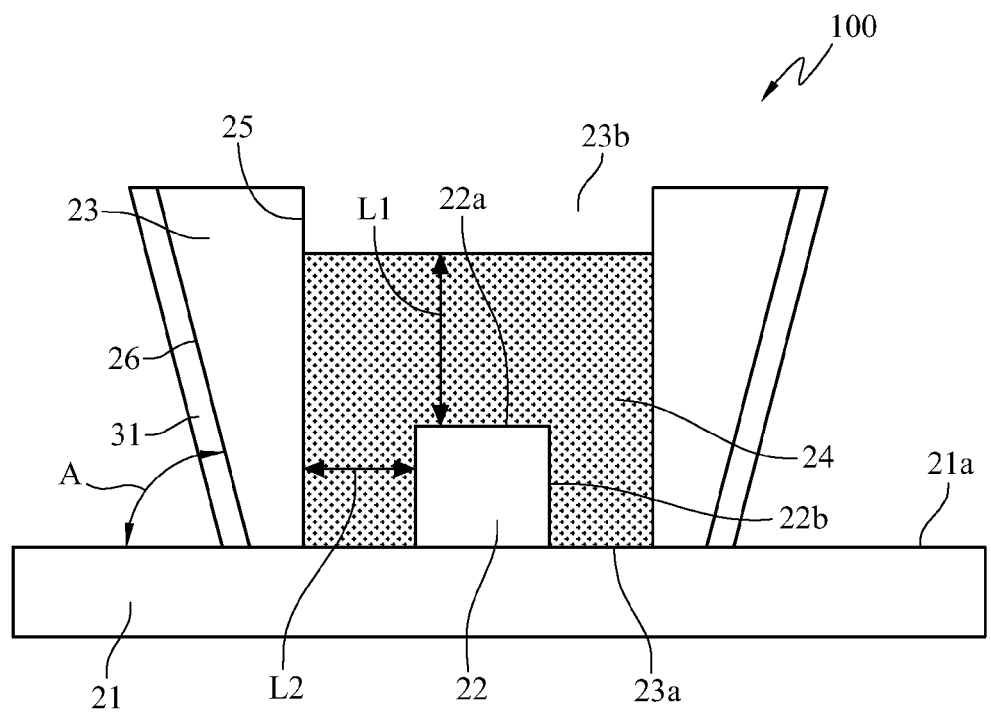
FIG. 10 is a schematic view of an axial section of a fourth embodiment of the present invention.

Referring to FIG. 10, a schematic view of the axial section according to a fourth embodiment of the present invention is shown. The fourth embodiment is the same as the first embodiment except that the tubular structure 23 has an inner tube wall 25 and an outer tube wall 26 with a reflective layer 31. The inner tube wall 25 is vertical to the surface 21a, and an acute angle A is formed between the outer tube wall 26 and the surface 21a. The angle of the acute angle A can be between 1 and 89 degrees. A reflective layer 31 is formed on the outer tube wall 26. The material of the reflective layer 31 can be, but is not limited to, metal or semiconductor.

When the light emitting chip 22 emits light rays with various different angles, after passing through the inner tube wall 25 of the tubular structure 23, the light ray with the large angle is reflected by the reflective layer 31 formed on the outer tube wall 26. The design of the tubular structure 23 is used to control the distribution scope of the fluorescent conversion layer 24 for adjusting the ratio of the maximal vertical thickness L1 and the maximal horizontal thickness L2 so as to prevent the problem that for the light ray with the larger incidental angle emitted by the light emitting chip 22, the path of the light rays passing through the fluorescent conversion layer 24 is longer, the energy is mostly converted to the yellow light excited from the fluorescent conversion layer 24, and thus results in the non-uniform color temperature. In the other aspect, the reflective layer 31 is used in coordination with the angle of the acute angle A such that the light rays with the larger incidental angle emitted by the light emitting chip 22 are reflected and emitted, so as to redirect the light rays emitted by the light emitting device 100 in the same direction.

Figure 11:
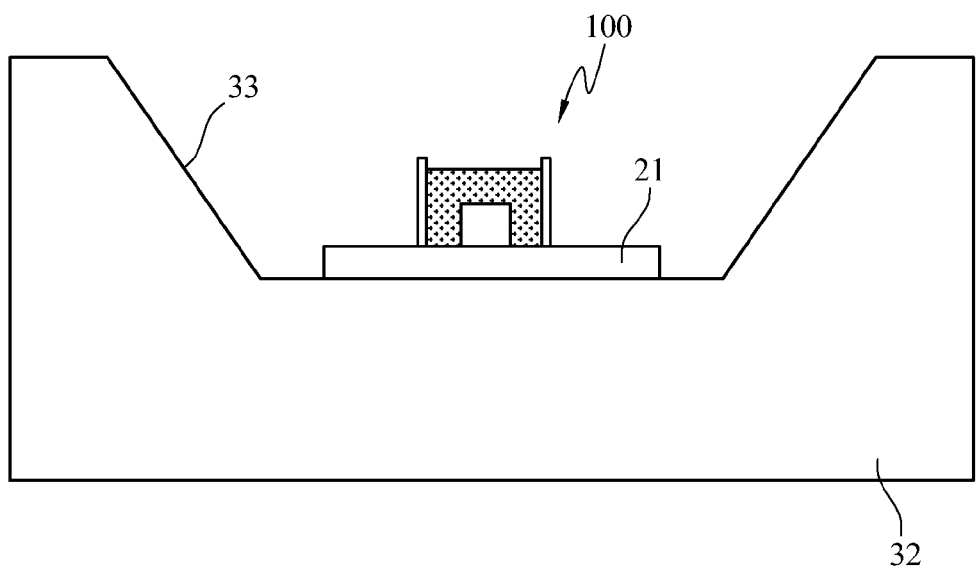
FIG. 11 is a schematic view of an axial section of a fifth embodiment of the present invention.

Referring to FIG. 11, a schematic view of the axial section according to a fifth embodiment of the present invention is shown. The fifth embodiment is the same as the first embodiment except that a package carrier 32 with a reflective layer 33 is further provided. The package carrier 32 is a cup carrier for carrying the substrate 21, and a reflective layer 33 is formed on an inner surface of the package carrier 32 for reflecting and redirecting the light rays emitted by the light emitting device 100 in the same direction. The material of the package carrier 32 can be, but is not limited to, ceramic, metal, plastic, or resin. The material of the reflective layer 33 can be, but is not limited to, metal or semiconductor.

Figure 12:
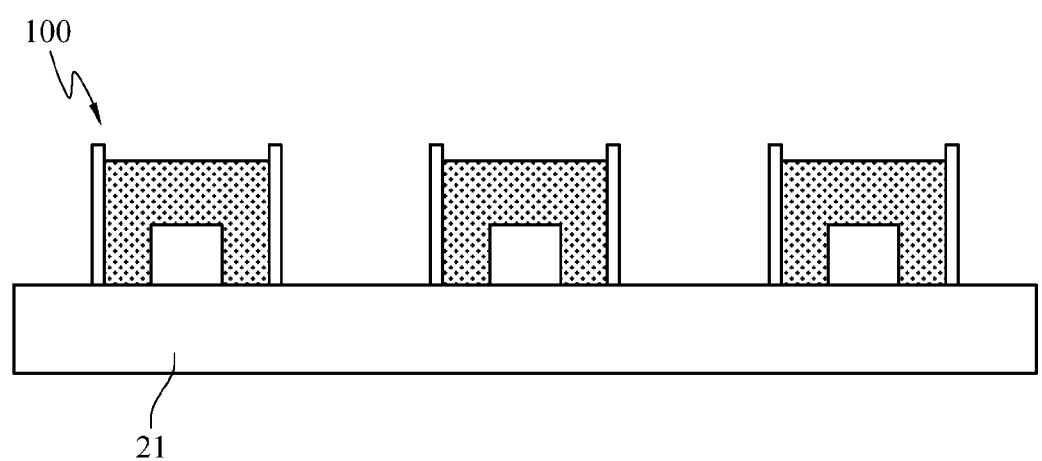
FIG. 12 is a schematic view of an axial section of a sixth embodiment of the present invention.

Referring to FIG. 12, a schematic view of the axial section according to a sixth embodiment of the present invention is shown. The sixth embodiment is the same as the first embodiment except that a plurality of light emitting devices 100 are formed on the same substrate 21.

Figure 13:
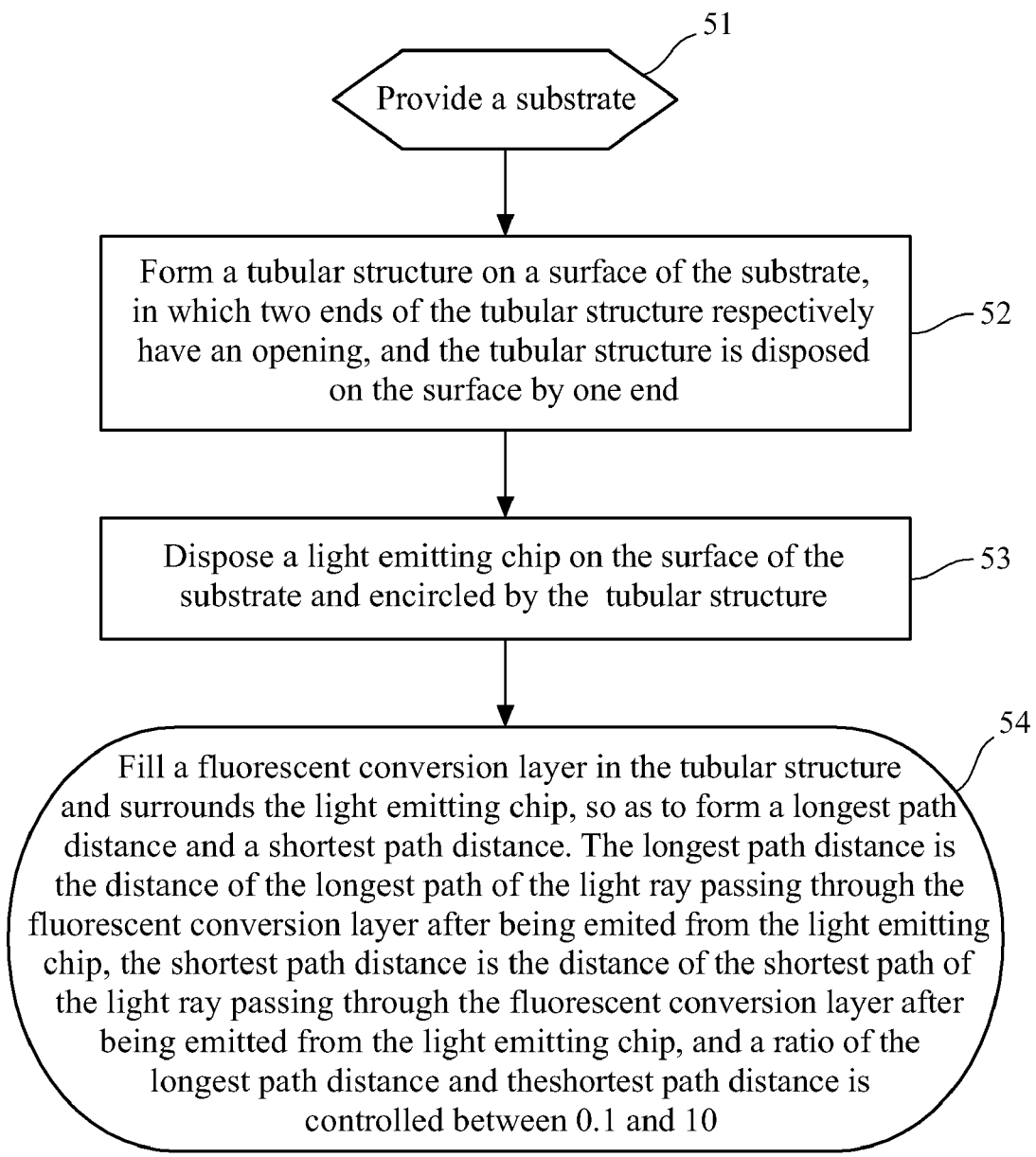
FIG. 13 is a flow chart of the fabrication of the first embodiment of the present invention.

Referring to FIG. 13, a flow chart of the fabrication of the first embodiment of the present invention is shown. A fabricating method of the light emitting device includes providing a heat conductive substrate (Step 51). A tubular structure is formed on a surface of the substrate, two ends of the tubular structure respectively have an opening, and the tubular structure is disposed on the surface by one end (Step 52). A light emitting chip is disposed on the surface of the substrate and is encircled by the tubular structure (Step 53). A fluorescent conversion layer is disposed in the tubular structure and surrounds the light emitting chip, and a ratio of a maximal vertical thickness and a maximal horizontal thickness of the fluorescent conversion layer at the light emitting chip is between 0.1 and 10 (Step 54).

The material of the substrate can be, but is not limited to, ceramic, metal, organic polymer, or silicon. The transparent tubular structure is formed by photolithography process, laser writing process, mold pressing, etching, or injection molding. The material of the tubular structure is provided for the light rays emitted by the light emitting device and the light rays excited from the fluorescent conversion layer to penetrate. The material of the tubular structure can be, but is not limited to, silica gel, resin, glass, or a mixture of silica gel and silica.

Figure 14:
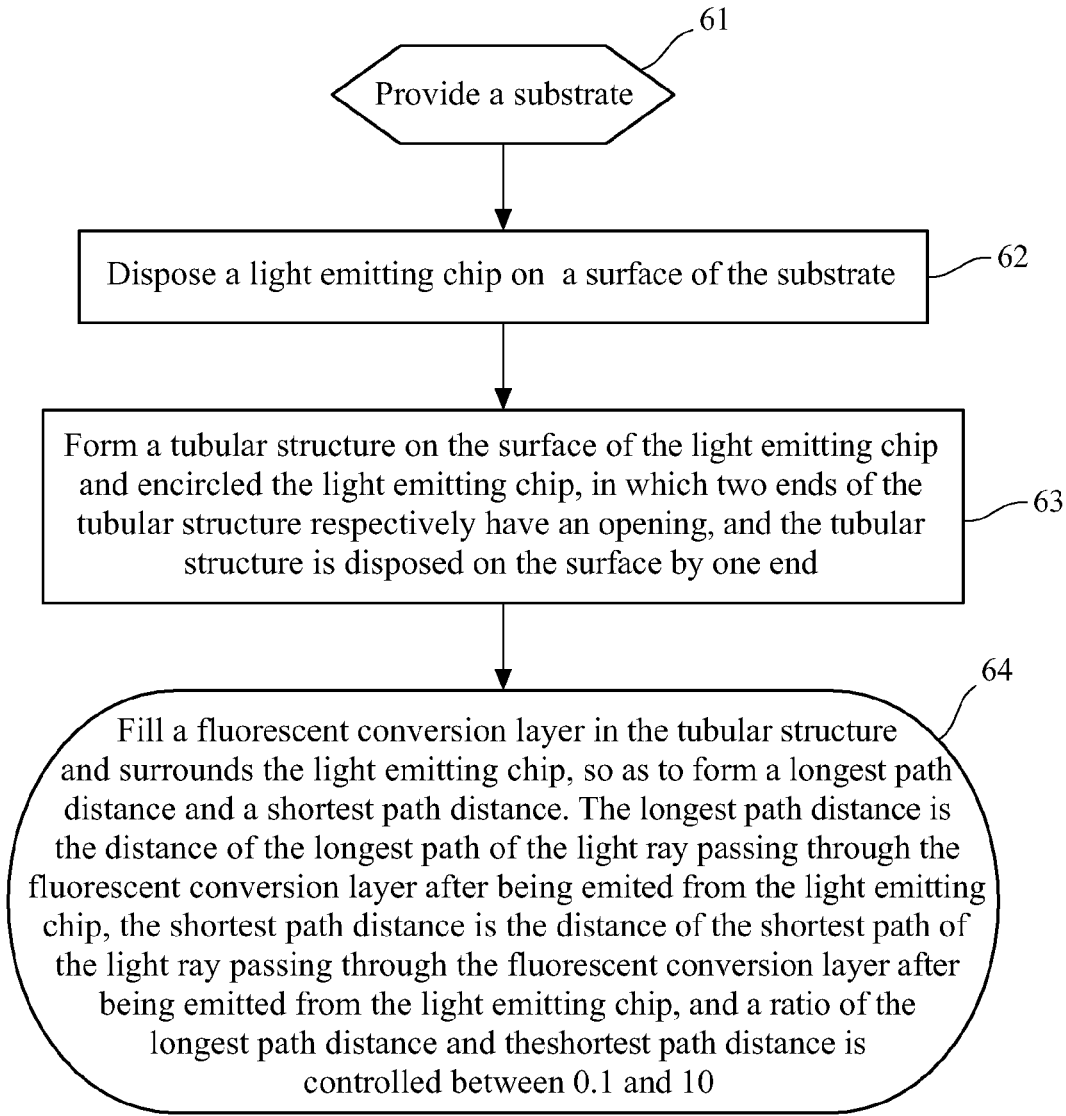
FIG. 14 is another flow chart of the fabrication of the first embodiment of the present invention.
Figure 15A:
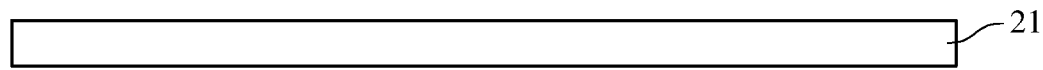
FIG. 15A is a schematic view of first step of the fabrication flow of the sixth embodiment of the present invention.
Figure 15B:
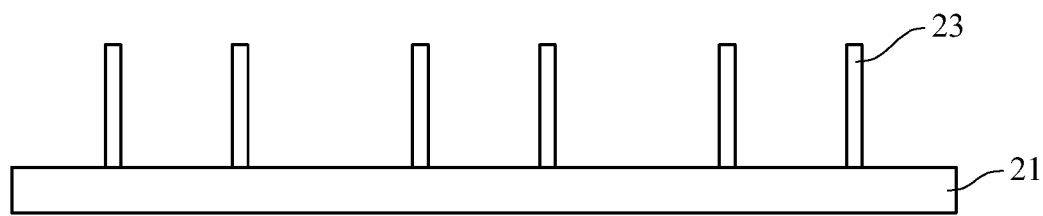
FIG. 15B is a schematic view of second step of the fabrication flow of the sixth embodiment of the present invention.
Figure 15C:
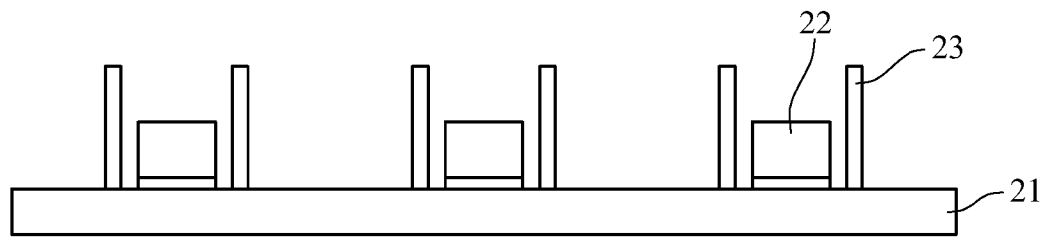
FIG. 15C is a schematic view of third step of the fabrication flow of the sixth embodiment of the present invention.
Figure 15D:
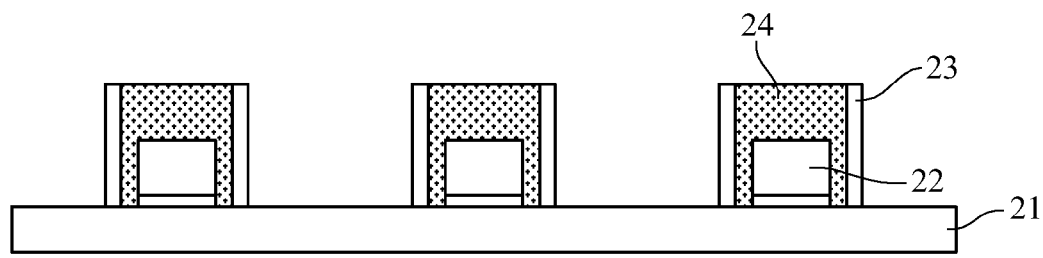
FIG. 15D is a schematic view of third step of the fabrication flow of the sixth embodiment of the present invention.

Referring to FIG. 14, another flow chart of the fabrication of the first embodiment of the present invention is shown. A fabricating method of the light emitting device includes providing a heat conductive substrate (Step 61). A light emitting chip is disposed on the surface (Step 62). A tubular structure is formed on the surface having the light emitting chip and encircles the light emitting chip, two ends of the tubular structure respectively have an opening, and the tubular structure is disposed on the surface by one end (Step 63). A fluorescent conversion layer is disposed in the tubular structure and surrounds the light emitting chip, and a ratio of a maximal vertical thickness and a maximal horizontal thickness of the fluorescent conversion layer at the light emitting chip is controlled between 0.1 and 10 (Step 64).

The material of the substrate can be, but is not limited to, ceramic, metal, organic polymer, or silicon. The transparent tubular structure is formed by photolithography process, laser writing process, mold pressing, etching, or injection molding. The material of the tubular structure is provided for the light rays emitted by the light emitting device and the light rays excited from the fluorescent conversion layer to pass through. The material of the tubular structure can be, but is not limited to, silica gel, resin, glass, or a mixture of silica gel and silica.

Referring to FIG. 15A, FIG. 15B, FIG. 15C, and FIG. 15D, these are schematic views of steps of the fabrication flow corresponding to the sixth embodiment of the present invention. Firstly, according to FIG. 15A, providing a heat conductive substrate 21. After that, according to FIG. 15B, forming the plural number of tubular structure 23 on a surface of the substrate 21, in which two ends of the tubular structure 23 respectively have an opening, and the tubular structure 23 is disposed on the surface by one end. Then, according to FIG. 15C, at least one light emitting chip 22 is disposed on the surface of the substrate 21 in each tubular structure 23. Alternatively, at least one light emitting chip 22 can be disposed on the heat conductive substrate 21 before forming the plural number of tubular structure 23 on the same. Finally, according to FIG. 15D, a fluorescent conversion layer 24 is filled in the tubular structure 23 and surrounds the light emitting chip 22, and a ratio of a maximal vertical thickness versus a maximal horizontal thickness of the fluorescent conversion layer 24 at the light emitting chip 22 is controlled between 0.1 and 10.

The material of the substrate can be, but is not limited to, ceramic, metal, organic polymer, or silicon. The transparent tubular structure is formed by photolithography process, laser writing process, mold pressing, etching, or injection molding. The material of the tubular structure is provided for the light rays emitted by the light emitting device and the light rays excited from the fluorescent conversion layer to pass through. The material of the tubular structure can be, but is not limited to, silica gel, resin, glass, or a mixture of silica gel and silica.

What is claimed is:

1. A light emitting device, comprising:
    a substrate, having a surface;
    at least one transparent tubular structure, formed on the surface of the substrate and including an inner tube wall and an outer tube wall, the inner tube wall being vertical to the surface, the outer tube wall and the surface forming an acute angle and having a space formed therebetween, wherein two ends of the at least one transparent tubular structure have respective openings, and the at least one transparent tubular structure is disposed on the surface of the substrate by one end;
    at least one light emitting chip, disposed on the surface of the substrate and surrounded by the at least one transparent tubular structure; and
    at least one fluorescent conversion layer, disposed in the at least one transparent tubular structure and covering the at least one light emitting chip, wherein the at least one transparent tubular structure limits a distribution scope of the fluorescent conversion layer, a ratio of a maximal vertical thickness and a maximal horizontal thickness of the at least one fluorescent conversion layer at the at least one light emitting chip is between 1.5 and 4 and a margin of error for color temperatures of emitted light is with in 300K; wherein
    the maximal vertical thickness is the maximal vertical distance from a top surface of the at least one light emitting chip to a top surface of the at least one fluorescent conversion layer,
    the maximal horizontal thickness is the maximal horizontal distance from an outer part of a side surface of the at least one light emitting chip to an outer side surface of the fluorescent conversion layer.

2. The light emitting device as claimed in claim 1, wherein a material of the substrate is ceramic, metal, organic polymer, or silicon.

3. The light emitting device as claimed in claim 1, wherein a shape of a radial section of the at least one transparent tubular structure is round, rectangular, or hexagonal.

4. The light emitting device as claimed in claim 1, wherein a shape of a liquid level of the at least one fluorescent conversion layer is a horizontal plane, a concave surface, or a convex surface.

5. The light emitting device as claimed in claim 1, wherein a material of the at least one transparent tubular structure is provided for light rays emitted by the at least one light emitting chip and light rays excited from the at least one fluorescent conversion layer to pass through.

6. The light emitting device as claimed in claim 5, wherein the material of the at least one transparent tubular structure is silica gel, a mixture of silica gel and silica, resin, or glass.

7. The light emitting device as claimed in claim 1, wherein the at least one transparent tubular structure further comprises a reflective layer formed on the outer tube wall.

8. The light emitting device as claimed in claim 1, wherein the at least one fluorescent conversion layer comprises a fluorescent powder and a resin.

9. The light emitting device as claimed in claim 1, further comprising a microlens disposed on the surface of the substrate and covering the at least one transparent tubular structure.

10. The light emitting device as claimed in claim 1, further comprising:
    a package carrier, adapted for carrying the substrate, and
    a reflective layer, formed on an inner surface of the carrier for carrying the substrate.

11. The light emitting device as claimed in claim 1, wherein the ratio of the maximal vertical thickness and the maximal horizontal thickness of the at least one fluorescent conversion layer at the at least one light emitting chip is between 1.8 and 4.

12. A light emitting device, comprising:
a substrate, having a surface;
at least one transparent tubular structure formed on the surface of the substrate, an outer tube wall of the at least one transparent tubular structure and the surface forming an acute angle and having a space formed therebetween, wherein two ends of the at least one transparent tubular structure have respective openings, and the at least one transparent tubular structure is disposed on the surface of the substrate by one end;
at least one light emitting chip, disposed on the surface of the substrate and surrounded by the at least one transparent tubular structure;
at least one fluorescent conversion layer, disposed in the at least one transparent tubular structure and covering the at least one light emitting chip, wherein a ratio of a maximal vertical thickness and a maximal horizontal thickness of the at least one fluorescent conversion layer at the at least one light emitting chip is between 1.5 and 4 so that a margin of error for color temperatures of emitted light is within 300K, wherein the maximal vertical thickness is the maximal vertical distance from a lowest part of a top surface of the at least one light emitting chip to a top surface of the at least one fluorescent conversion layer, and the maximal horizontal thickness is the maximal horizontal distance from an outer part of a side surface of the at least one light emitting chip to an outer side surface of the at least one fluorescent conversion layer;
at least one microlens, disposed on the surface of the substrate and covering completely the at least one transparent tubular structure; and
a package carrier, for carrying the substrate;
wherein the at least one transparent tubular structure limits a distribution scope of the at least one fluorescent conversion layer so that the ratio of the maximal vertical thickness versus the maximal horizontal thickness is adjusted to be between 1.5 and 4.

13. The light emitting device as claimed in claim 12, wherein the ratio of the maximal vertical thickness and the maxmal horizontal thickness of the at least one fluorescent conversion layer at the at least one light emitting chip is between 1.8 and 4.

* * * * *